United States Patent [19]

Habuka et al.

[11] Patent Number: 5,718,762

[45] Date of Patent: Feb. 17, 1998

[54] METHOD FOR VAPOR-PHASE GROWTH

[75] Inventors: Hitoshi Habuka, Gunma-ken, Japan; Naoto Tate, Camas, Wash.; Masanori Mayuzumi, Gunma-ken, Japan; Hitoshi Tsunoda, Fukushima-ken, Japan; Masatake Katayama, Gunma-ken, Japan

[73] Assignee: Shin-Etsu Handotai Co., Ltd., Tokyo, Japan

[21] Appl. No.: 607,566

[22] Filed: Feb. 27, 1996

[30] Foreign Application Priority Data

Mar. 1, 1995 [JP] Japan ................. 7-066883

[51] Int. Cl.⁶ .................................. C30B 25/20
[52] U.S. Cl. ................. 117/97; 117/89; 117/90
[58] Field of Search .................. 117/89, 90, 94, 117/96, 103, 97

[56] References Cited

U.S. PATENT DOCUMENTS

| 4,115,163 | 9/1978 | Gorina et al. | 117/103 |
|---|---|---|---|
| 5,023,750 | 6/1991 | Hirayama | 361/313 |
| 5,221,412 | 6/1993 | Kagata et al. | 117/94 |
| 5,365,877 | 11/1994 | Kubota | 117/93 |

FOREIGN PATENT DOCUMENTS 296804  12/1988  European Pat. Off. .

OTHER PUBLICATIONS

Materials Science and Engineering B, vol. b4, No. 1/4, Oct. 1989, Lausanne, CH Oct. 1989 France.
"Crystalline Defects, Thermal Processing, and Gettering", Wolf, et al; Silicon Processing for the VLSI Era–vol. 1 Process Technology; pp. 45–47.

*Primary Examiner*—Felisa Garrett
*Attorney, Agent, or Firm*—Ronald R. Snider

[57] ABSTRACT

A method for vapor-phase growth which allows an epiwafer of a smooth surface free from microroughness to be produced is provided. This method comprises a step of heating up a silicon single crystal substrate in an ambience of an inert gas started at a temperature of less than 800° C. and a step of removing a native oxide film formed on the surface of the silicon single crystal substrate by etching with hydrogen gas in an ambience of hydrogen gas at a temperature of not less than 950° C. and not more than 1190° C. prior to the vapor-phase growth.

15 Claims, 6 Drawing Sheets

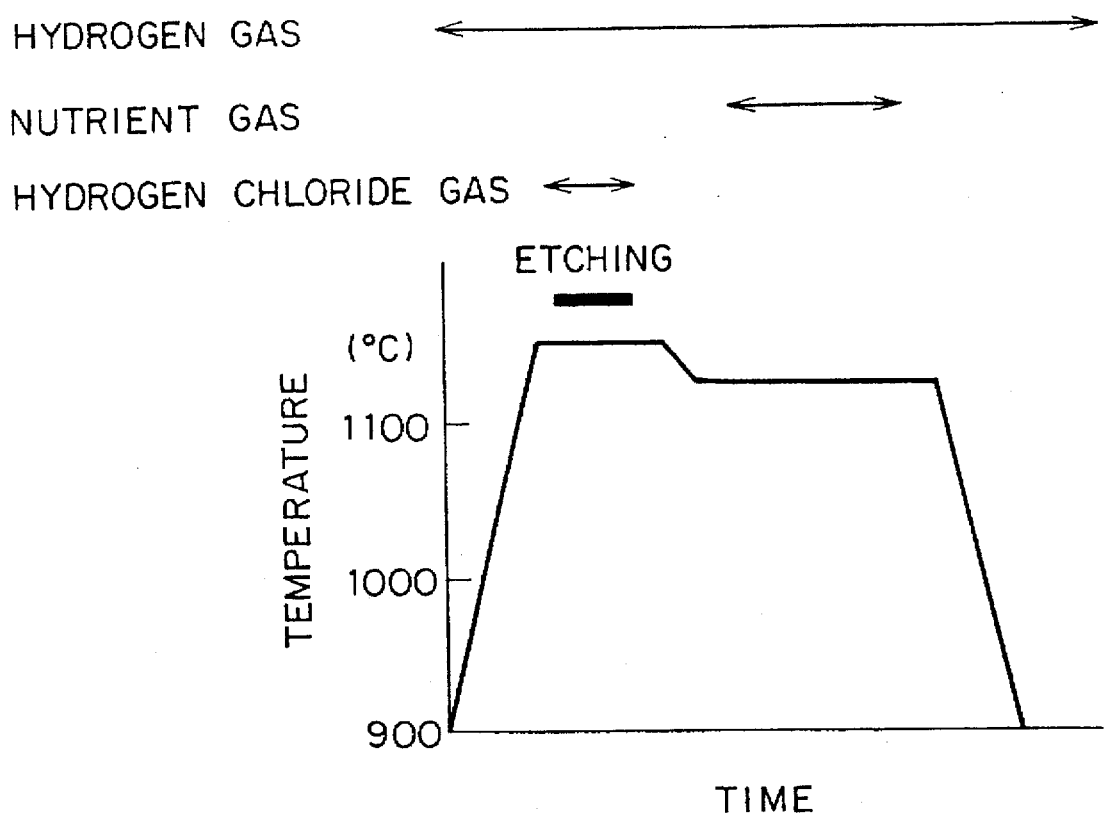

FIG. 7
(a) AT ABOUT 1100°C
(b) AT ABOUT 900°C
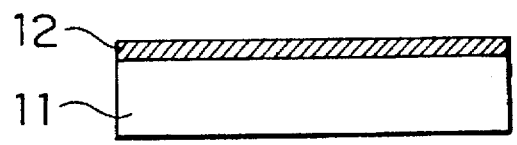
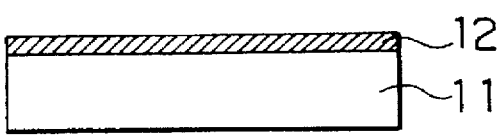
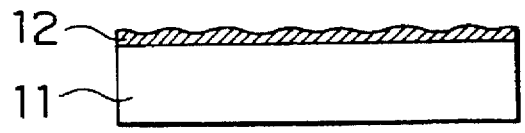
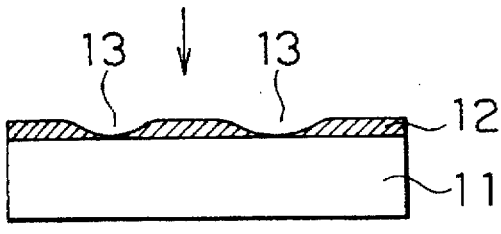
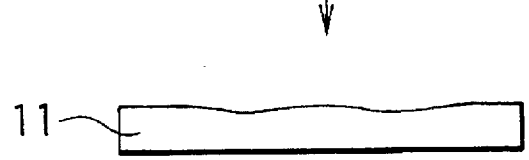
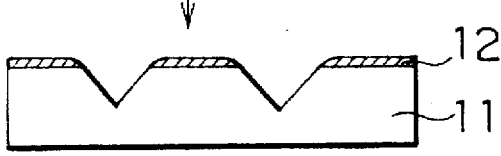
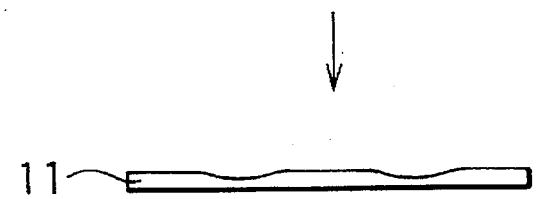
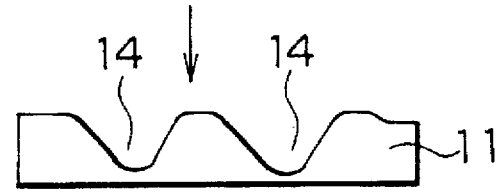

METHOD FOR VAPOR-PHASE GROWTH

BACKGROUND OF THE INVENTION

1. Field of the Invention

This invention relates to a method for the vapor-phase growth of a thin film of silicon single crystal on a silicon single crystal substrate. More particularly, this invention relates to an ambience which is prepared for the vapor-phase growth of a thin film of silicon single crystal.

2. Description of the Prior Art

Heretofore, in the vapor-phase growth of a thin film of silicon single crystal on a silicon single crystal substrate, the temperature of the substrate has been raised in an ambience of hydrogen gas. When the silicon single crystal substrate is transported from a preceding chamber whose ambience of air is displaced with an ambience of nitrogen gas in advance into a reaction vessel having a temperature near 900° C., for example, this silicon single crystal substrate is heated in the ambience of hydrogen gas up to an etching temperature of desirable degree as shown in FIG. 6.

Then, hydrogen chloride gas is introduced into the reaction vessel and used therein to etch the surface of the silicon single crystal substrate and a nutrient gas is also introduced therein to induce vapor-phase growth of a thin film of silicon single crystal having a desirable thickness. After the vapor-phase growth is completed, the heating is stopped and the interior of the reaction vessel is cooled before the substrate on which the vapor-phase growth of a thin film of silicon single crystal has been accomplished (hereinafter referred to as "epiwafer") is delivered from the reaction vessel.

SUMMARY OF THE INVENTION

The conventional method of this principle, however, has the possibility of giving rise to a minute undulation (small hills and valleys) called microroughness in a wide area of the epiwafer surface. When the epiwafer surface is illuminated under a focused beam of light in a dark room, the area with large microroughness scatters the incident light randomly and appears to be a white cloud, which is popularly referred to as "cloud" or "haze." Ideally, the epiwafer surface has the surface free from microroughness.

When hydrogen chloride gas is used for etching the surface of a silicon single crystal substrate, this etching issues such problems detrimental to the production of an epiwafer as corrosion in interiors of a storage tank, a feed pipe, and a furnace and eventually give a metallic contamination of silicon single crystal substrate due to the corrosion, and further etching the surface of the silicon single crystal substrate by the hydrogen chloride gas remaining during the vapor-phase growth of a thin film of silicon single crystal substrate and consequently enhance of autodoping.

This invention, produced in the light of the true state of prior art mentioned above, has for an object thereof the provision of a method for the vapor-phase growth which allows an epiwafer having a smooth surface free from microroughness to be produced infallibly and also the provision of a method for the vapor-phase growth which affects the etching of the silicon single crystal substrate by a process instead of the conventional process using hydrogen chloride gas.

BRIEF DESCRIPTION OF THE DRAWINGS

The invention will be better understood and objects, features, and characteristics thereof other than those set forth above will become obvious when consideration is given to the following detailed description thereof. Such description makes reference to the annexed drawings wherein:

FIG. 6 prior art is an explanatory process diagram showing the conventional method for the vapor-phase growth.

DETAILED DESCRIPTION OF THE PREFERRED EMBODIMENT

The step of heat-up in the ambience of an inert gas is continued until the temperature reaches a level appropriate for the removal of the native oxide film formed on the surface of said silicon single crystal substrate by the etching with hydrogen gas. The above step is desirably started at a temperature of less than 800° C.

The temperature which is appropriate for the removal of the native oxide film by the etching with hydrogen gas is such that the rate of etching the native oxide film caused by the hydrogen gas is not less than $\frac{1}{10}$ of the rate of etching silicon single crystal. Specifically, this temperature is not less than 950° C. and not more than 1190° C., for example.

The inert gas to be used appropriately is one gas species selected from the group consisting of helium, neon, argon, krypton, and xenon or a rare gas prepared by mixing two or more gases selected from the group.

Figure 7A:
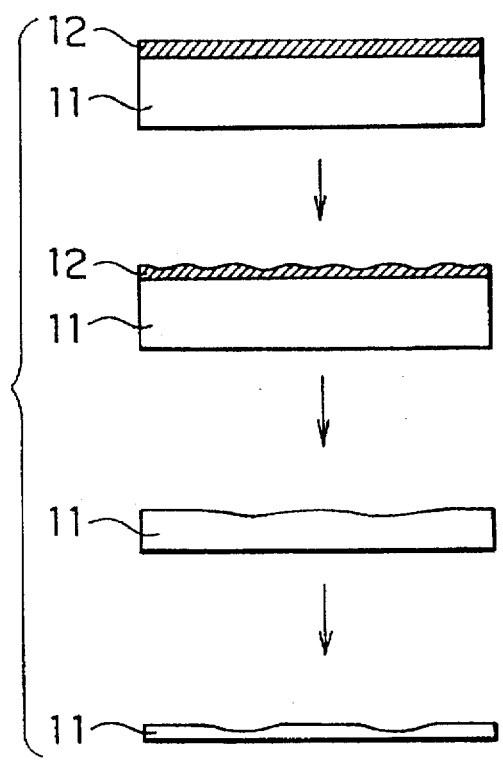
FIG. 7 is a schematic explanatory diagram showing the manner in which native oxide film and a silicon single crystal substrate are removed by etching with hydrogen gas; (a) the etching at about 1100° C. and (b) the etching at about 900° C.
Figure 7B:
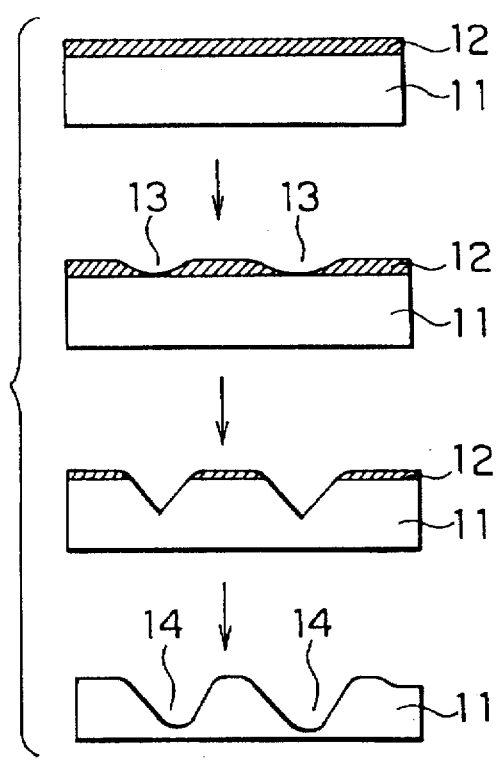

The present inventor has searched for the cause of the generation of microroughness and has consequently found that when a native oxide film ($SiO_2$) with a thickness of about 1.5 nm on the surface of a silicon single crystal substrate is etched during heating up the silicon single crystal substrate in an ambience of hydrogen gas, the etching gives a small pits as indicated in FIG. 7(b) and the surface of the silicon single crystal substrate 11 begins to be etched sequentially from a part 13 where a native oxide film 12 has been completely removed and, as a result, forms therein a part etched deeply with the hydrogen gas and a part etched shallowly therewith, and ultimately induces the formation of an undulation 14 (small hills and valleys) on the surface of the silicon single crystal substrate 11.

When heated in an ambience of hydrogen to a temperature of not less than about 800° C., the native oxide film 12 is etched by hydrogen without use of hydrogen chloride gas. At temperatures in the approximate range of 800° C. to 900° C., the native oxide film 12 is removed incompletely on the entire surface of the silicon single crystal substrate 11. In the environment of this etching, the surface of the substrate 11 is divided into two parts; in the one part the etching of the native oxide film proceeds quickly and the surface of silicon single crystal substrate 11 is exposed quickly to the ambience of hydrogen and such quick etching as mentioned above does not proceed in the other part.

Incidentally, the etching rate of hydrogen at about 900° C. is about 0.7 nm/min for the silicon single crystal substrate and about 0.05 nm/min for the native oxide film. In other words, the etching rate of the silicon single crystal substrate exhibited by hydrogen is about 14 times higher than that on the native oxide film. In this case, when the surface of the silicon single crystal substrate 11 is partly exposed, the part exposed is etched at a rate about 14 times higher than the etching rate of the native oxide film 12. Thus, only incomplete etching of the native oxide film 12 is amplified so much as to give rise to the undulation 14. This undulation 14 causes microroughness.

More specific, when the silicon single crystal substrate is transported into the reaction vessel enclosing therewith an ambience of hydrogen at a temperature near 900° C. which is the temperature to amplify the unevenness of the surface due to the hydrogen etching of the native oxide film as has been observed conventionally, the microroughening inevitably occurs because the period kept at about 900° C. before starting the heating-up process is elongated as a natural consequence.

In contrast, at a temperature near 1100° C., the etching rate of the native oxide film by hydrogen is about 1 nm/min; this value is roughly 20 times higher than that at a temperature near 900° C., and the rate of etching is roughly equal to that of the silicon single crystal substrate.

At a temperature in the approximate range of 800° C. to 900° C., therefore, the temperature of the silicon single crystal substrate is raised in an ambience of an inert gas so as to preclude the otherwise possible removal of the native oxide film. Only at temperatures near 1100° C., i.e. the temperature appropriate for the removal of the native oxide film on the surface of the silicon single crystal substrate by hydrogen gas, the hydrogen gas is introduced to contact with the silicon single crystal substrate. As a result, the native oxide film on the surface of silicon single crystal substrate is quickly removed over the entire area thereof. At near 1100° C., since the etching rate of hydrogen gas is substantially equal between the native oxide film and of the silicon single crystal substrate, the unevenness of etching the native oxide film is not amplified on the surface of the substrate as shown in FIG. 7(a) and the microroughness can not be increased.

Now, an embodiment of this invention will be described below with reference to the accompanying drawings.

EXAMPLE

Figure 1:
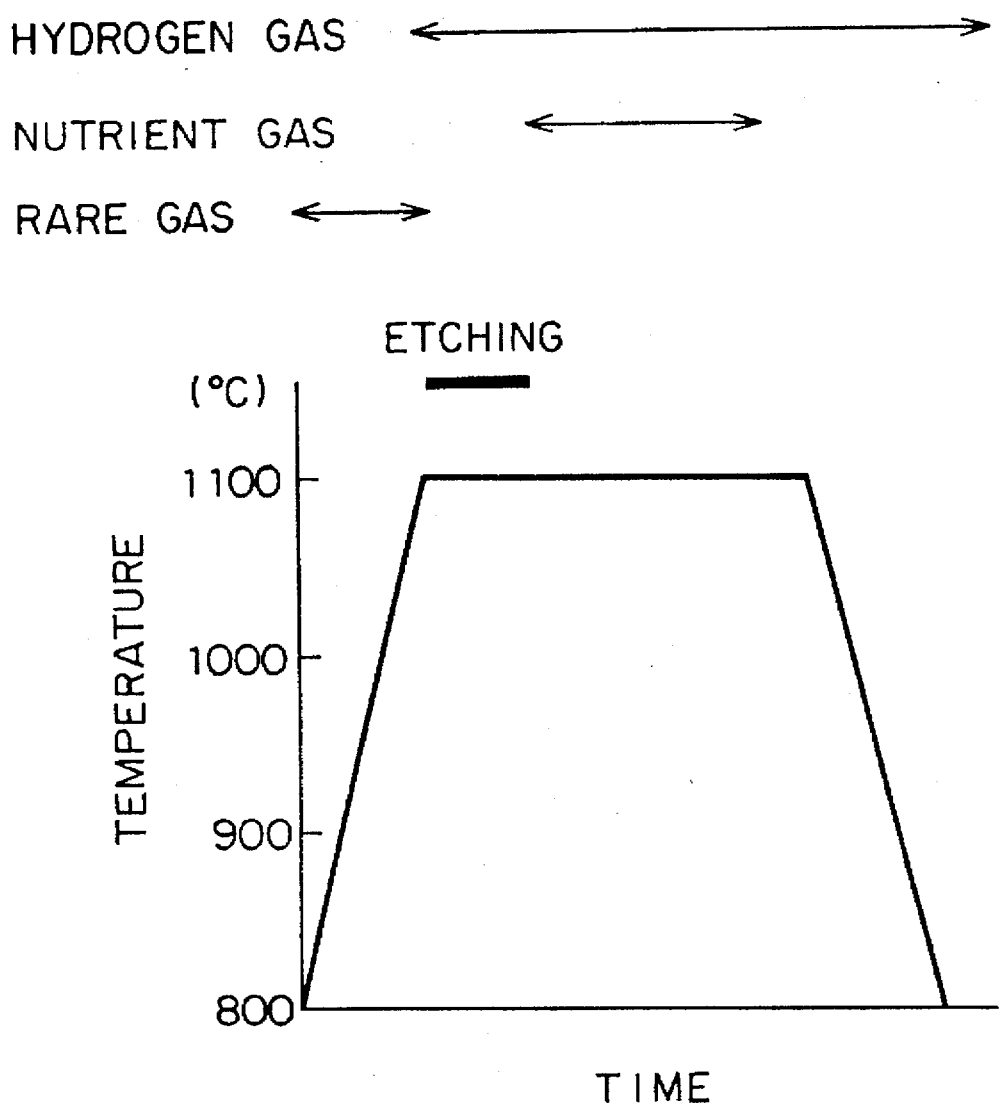
FIG. 1 is an explanatory process diagram showing an embodiment of this invention.

FIG. 1 shows a process for the production of a thin film of silicon single crystal following the method of this invention for the vapor-phase growth. In this embodiment, such a cold wall type apparatus for vapor-phase growth as shown in FIG. 2 is used to perform vapor-phase growth of a thin film 2 of silicon single crystal (hereinafter referred to as "thin film 2") on the surface of a silicon single crystal substrate 1 (hereinafter referred to as "substrate 1").

Figure 2:
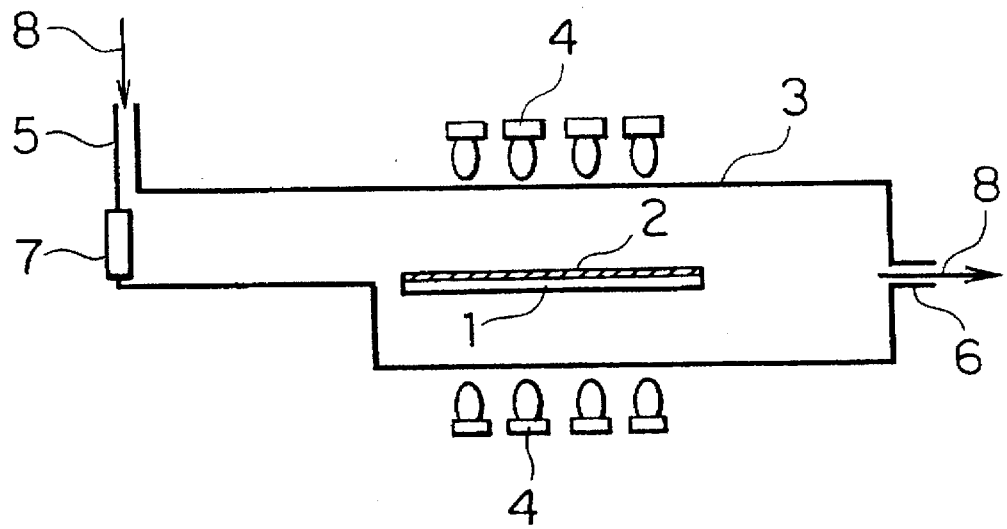
FIG. 2 is an explanatory diagram showing an apparatus for the vapor-phase growth used in the first embodiment.

The apparatus for vapor-phase growth mentioned above is a horizontal single-wafer apparatus for vapor-phase growth which is provided, as shown in FIG. 2, with a reaction vessel 3 made of transparent quartz glass, an infrared radiation heating lamp 4 set in place outside the reaction vessel 3, a gas inlet 5 for a gas 8 to be used for the vapor-phase growth, a gas outlet 6, and a gate valve 7.

To implement the production of the than film 2, the substrate 1 is first transported from a preceding chamber (not shown) enclosing therewith an ambience of nitrogen through the gate valve 7 into the reaction vessel 3 kept cooled at about 700° C. and it is then set horizontally inside the reaction vessel 3. The interior of the reaction vessel is displaced in advance with argon gas. The process for heating up the substrate 1 begins as soon as the substrate 1 is set in the reaction vessel 3.

For the purpose of keeping the surface conditions of the substrate 1 and the thin film 2 appropriate, it is necessary that the interior of the reaction vessel 3 is kept under an ambience of argon gas until the temperature is heated up to near 1100° C. However, the use of a large volume of argon gas is more expensive than hydrogen gas in terms of cost.

By an experiment which consisted in displacing the interior of the reaction vessel 3 with an ambience of hydrogen gas during the heating-up process up to 900° C., 1000° C., and 1100° C. in the ambience of argon gas, the conditions of the occurrence of microroughness at the various temperatures were compared to find the specific temperature necessary for retaining the interior of the reaction vessel 3 under the ambience of argon gas during the heating-up process.

First, the heating-up process in the ambience of argon gas was started immediately after completion of the transporting the substrate 1 into the reaction vessel 3 and was continued to reach the relevant temperature condition. Subsequently, the interior of the reaction vessel 3 was displaced with an ambience of hydrogen gas. In the present experiment, the conditions for increasing microroughness were obtained by retaining the substrate 1 under the relevant temperature condition for 3 minutes.

Then, the substrate 1 was retained in the ambience of hydrogen gas at 1100° C. for two minutes to attain complete removal of the native oxide film. Thereafter, with trichlorosilane as a source gas, the thin film 2 was grown in a thickness of about 6 μm at a temperature of 1100° C. over a period of 2 minutes.

Figure 3:
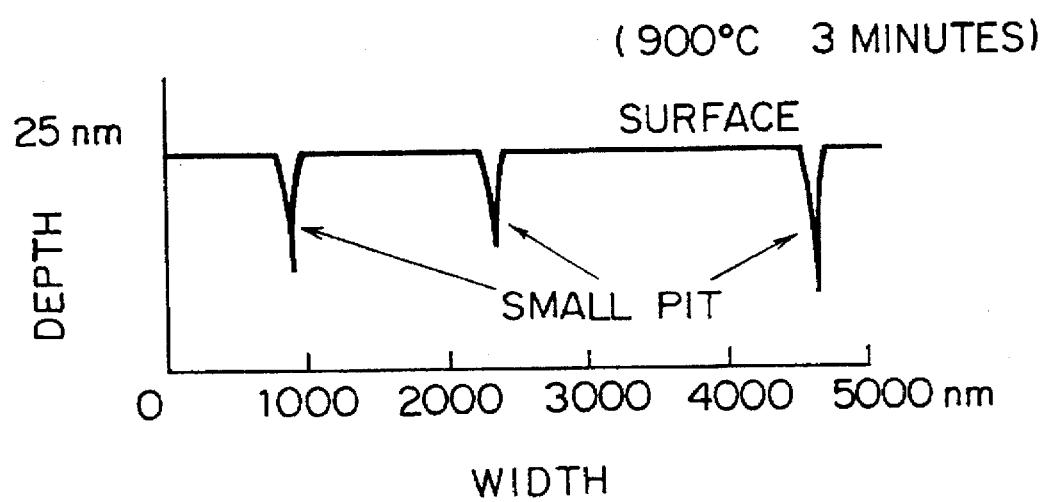
FIG. 3 is a graph showing the level of the microroughness which occurs when an ambience of argon gas is displaced with an ambience of hydrogen gas at 900° C. in a reaction vessel in the heat-up process.
Figure 4:
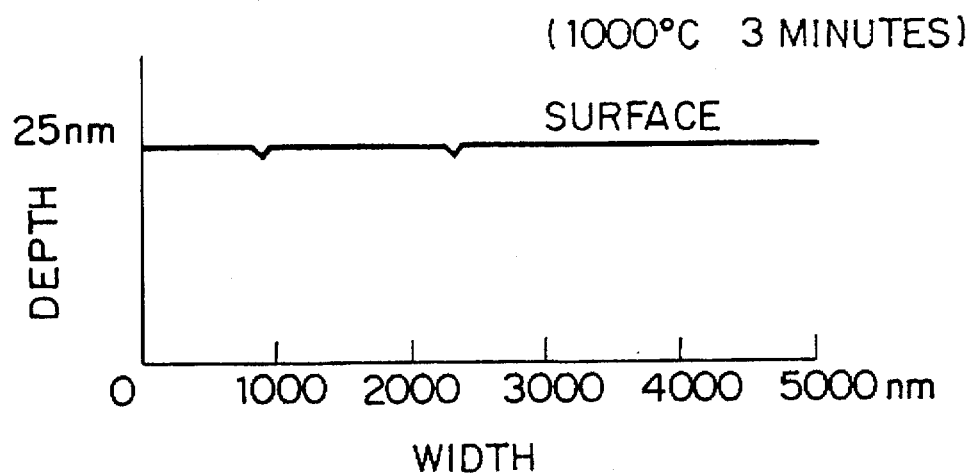
FIG. 4 is a graph showing the level of the microroughness which occurs when an ambience of argon gas is displaced with an ambience of hydrogen gas at 1000° C. in a reaction vessel in the heat-up process.
Figure 5:
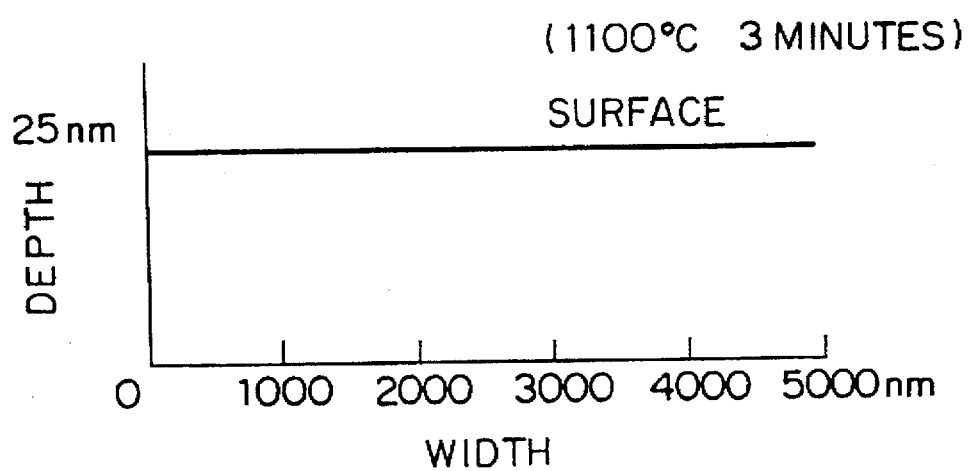
FIG. 5 is a graph showing the level of the microroughness which occurs when an ambience of argon gas is displaced with an ambience of hydrogen gas at 1100° C. in a reaction vessel in the heat-up process.

The surface of the thin film 2 grown in consequence of the present experiment was observed using the atomic force microscope. The results are the graphs of FIG. 3 through FIG. 5. It is noted from the graph of FIG. 3 that the substrate was deeply etched and the microroughness was notably serious when the interior of the reaction vessel 3 was displaced with the ambience of hydrogen gas at 900° C. In contrast, at the temperatures of 1000° C. and 1100° C., virtually no sign of etching was observed on the surface of the substrate as indicated by the data of FIG. 4 and FIG. 5.

As a result of a further study continued on the basis of the results of the present experiment, it was found that the micro-roughness occurred when the interior of the reaction vessel 3 was displaced with an ambience of hydrogen gas at a temperature in the approximate range of 800° C. to 900° C. It was further found that the occurrence of microroughness could be prevented so long as the temperature to switch the ambience from an inert gas to hydrogen was not less than 950° C., at which the etching rate of the native oxide film by hydrogen gas exceeded 1/10 of the etching rate on the silicon single crystal. If the temperature of the substrate of silicon single crystal exceeds 1190° C., however, the disadvantage will appear that detriments such as the phenomena of autodoping and slippage cannot be ignored.

The present embodiment contemplates using argon gas as an inert gas. In this invention, the inert gas need not be limited to argon gas but may be one selected from the group consisting of helium, neon, krypton, and xenon or a rare gas prepared by mixing two or more gases selected from the group. It is also allowable to use nitrogen as the inert gas, however, the nitride formation must be cared.

It is clearly noted from above that the method of this invention for the vapor-phase growth allows an epiwafer of a smooth surface free from microroughness to be produced because the silicon single crystal substrate is heated up to the temperature higher than 800° or 900° C. in an ambience of an inert gas for preventing the native oxide film from being unevenly etched.

Further, the method can preclude the problem that the use of hydrogen chloride gas results in metallic contamination at the substrate surface and autodoping.

What is claimed is:

1. A method for vapor-phase growth of a thin film of silicon single crystal on a surface of a silicon single crystal substrate, comprising the steps of:

heating up said silicon single crystal substrate in an ambience of a gas consisting essentially of an inert gas; and removing a native oxide film formed on said surface of said silicon single crystal substrate by etching with hydrogen gas prior to said vapor-phase growth.

2. The method according to claim 1, wherein said step of heating up in said ambience of an inert gas is continued until said temperature becomes appropriate for the removal of the native oxide film formed on the surface of said silicon single crystal substrate by said etching with hydrogen gas.

3. The method according to claim 2, wherein said temperature appropriate for the removal of the native oxide film by the etching with hydrogen gas is such that the etching rate caused by the hydrogen gas of the native oxide film is not less than 1/10 of the etching rate of silicon single crystal.

4. The method according to claim 3, wherein said temperature appropriate for the removal of the native oxide film by the etching with hydrogen gas is not less than 950° C. and not more than 1190° C.

5. The method according to claim 1, wherein said step of heating up in said ambience of an inert gas is started at a temperature of less than 800° C.

6. The method according to claim 1, or claim 3, wherein said inert gas is one selected from the group consisting of helium, neon, argon, krypton, and xenon or a rare gas prepared by mixing two or more gases selected from said group.

7. A method for vapor-phase growth of a thin film of silicon single crystal on a surface of a silicon single crystal substrate comprising the steps of:

heating up said silicon single crystal substrate in an ambience of an inert gas; and removing a native oxide film formed on said surface of said silicon single crystal substrate by etching with hydrogen gas prior to said vapor-phase growth;

wherein said step of heating up in said ambience of an inert gas is continued until a temperature of said silicon single crystal substrate becomes appropriate for the removal of the native oxide film formed thereon by said etching with hydrogen gas.

8. The method according to claim 7 wherein said step of heating up in said ambience of an inert gas is started at a temperature of less than 800° C.

9. The method according to claim 8, wherein said temperature appropriate for the removal of the native oxide film by the etching with hydrogen gas is not less than 950° C. and not more than 1190° C.

10. The method according to claim 7 wherein said temperature appropriate for the removal of the native oxide film by the etching with hydrogen gas is such that the etching rate caused by the hydrogen gas on the native oxide film is not less than 1/10 of the etching rate of silicon single crystal.

11. The method according to claim 7 wherein said inert gas is one selected from the group consisting of helium, neon, argon, krypton, and xenon or a rare gas prepared by mixing two or more gases selected from said group.

12. A method for a vapor-phase growth of a thin film of silicon single crystal substrate, comprising the steps of:

heating up said silicon single crystal substrate started at a temperature of less than 800° C. in an ambience of a gas consisting essentially of an inert gas; and removing a native oxide film formed on said surface of said silicon single crystal substrate by etching with hydrogen gas at a temperature not less than 950° C. and not more than 1190° C.

13. The method according to claim 12, wherein said step of heating up in said ambience of an inert gas is continued until said temperature becomes appropriate for the removal of the native oxide film formed on the surface of said silicon single crystal substrate by said etching with hydrogen gas.

14. The method according to claim 13, wherein said temperature appropriate for the removal of the native oxide film by the etching with hydrogen gas is such that the etching rate caused by the hydrogen gas on the native oxide film is not less than 1/10 of the etching rate of silicon single crystal.

15. The method according to claim 12, wherein said inert gas is one selected from the group consisting of helium, neon, argon, krypton, and xenon or a rare gas prepared by mixing two or more gases selected from said group.

* * * * *